(12) United States Patent
Guo et al.

(10) Patent No.: US 7,183,700 B2
(45) Date of Patent: Feb. 27, 2007

(54) ORGANIC LIGHT EMITTING DIODE DISPLAY HAVING RED, BLUE, AND GREEN COLORS EMITTED USING HEATING CIRCUIT STRUCTURE

(75) Inventors: Wen-Yuan Guo, Chia-Yi Hsien (TW); Wei-Chieh Hsueh, Tai-Nan (TW); An Shih, Chang-Hua Hsien (TW); Shih-Chang Chang, Hsin-Chu Hsien (TW)

(73) Assignee: TPO Displays Corp., Chu-Nan (TW)

( * ) Notice: Subject to any disclaimer, the term of this patent is extended or adjusted under 35 U.S.C. 154(b) by 266 days.

(21) Appl. No.: 10/711,021

(22) Filed: Aug. 18, 2004

(65) Prior Publication Data
US 2005/0140273 A1 Jun. 30, 2005

(30) Foreign Application Priority Data
Dec. 31, 2003 (TW) .............................. 92137764 A (51) Int. Cl.
*H01J 61/52* (2006.01)

(52) U.S. Cl. ........................................ 313/46; 313/498
(58) Field of Classification Search ................ 313/46, 313/498–509; 315/105–107, 101, 169.3
See application file for complete search history.

(56) References Cited

U.S. PATENT DOCUMENTS

2002/0047581 A1* 4/2002 Koyama .................. 315/169.3

* cited by examiner

*Primary Examiner*—Joseph Williams
*Assistant Examiner*—Bumsuk Won
(74) *Attorney, Agent, or Firm*—Winston Hsu (57) ABSTRACT

An organic light emitting diode (OLED) display includes a substrate defined with a plurality of pixel areas, a heating circuit structure disposed on the substrate, and a plurality of OLEDs corresponding to each pixel area. The heating circuit structure includes two conductive lines not connected to each other, a plurality of heating lines electrically connected to the two conductive lines and covering portions of each pixel areas, and a ground electrode.

20 Claims, 13 Drawing Sheets

ORGANIC LIGHT EMITTING DIODE DISPLAY HAVING RED, BLUE, AND GREEN COLORS EMITTED USING HEATING CIRCUIT STRUCTURE

BACKGROUND OF INVENTION

1. Field of the Invention

The present invention relates to an organic light emitting diode (OLED) display, and more particularly, to an organic light emitting diode display having a heating circuit structure for directly forming pixels having different colors by utilizing a heating process.

2. Description of the Prior Art

In various types of flat panel displays, since an OLED display, being developed later than a liquid crystal display (LCD), has many beneficial characteristics, such as having a spontaneous light source, a wide viewing angle, high response velocity, power saving, strong contrast, high brightness, small thickness, full-color, simpler structure, and a wide operating temperature, the OLED display has been used extensively in small and medium scale portable display fields. After continuous research and development by manufacturers and scholars, breakthroughs on some unresolved problems, such as low yield rate, unsatisfied mask application, unstable cap seal, there has been significant progress. In the future, the OLED will probably even be used in the large-size display field.

When analyzing the future development of the organic light emitting diode display, it is very important to realize the driving method of an OLED display. The OLED display is an electrically driven lighting element having a brightness that depends on the magnitude of a related current. At present, the magnitude of the brightness (which is also called the gray-scale value) is controlled by the magnitude of the OLED driving current in an application of OLED matrix display. Based upon the driving method, the matrix display can be classified as either a passive matrix display or an active matrix display. Passive matrix displays adopt the method of driving the scan lines of the display in sequence, driving pixels in different rows sequentially. Since the light-emitting time of each pixel is restricted by the scanning frequency and the numbers of scan lines, the passive matrix method is not suitable for large-size and high resolution (when the number of the scan lines is increased) displays.

Active matrix displays, however, possess an independent pixel circuit for each pixel, which includes a capacitor (C), an OLED light-emitting component, and at least two thin-film transistors (TFTs) that are used to adjust the OLED driving current. With this arrangement, even in large-size and high resolution displays, a steady driving current is provided to each pixel, which improves the brightness balance.

Similar to other types of displays, when an OLED display is used to realize colored images, red light beams, green light beams, and blue light beams need to be formed first. Conventionally, materials for generating white light beams are utilized. White light beams then pass through red, green, and blue light filters for transforming the white light beams into colored light beams. However, color filters need to be used in this method. Under the circumstances, the alignment accuracy needs to be controlled to maintain the balance of the colored light beams, leading to limitation in layout. Consequently, the aperture ratio is reduced.

Figure 1:
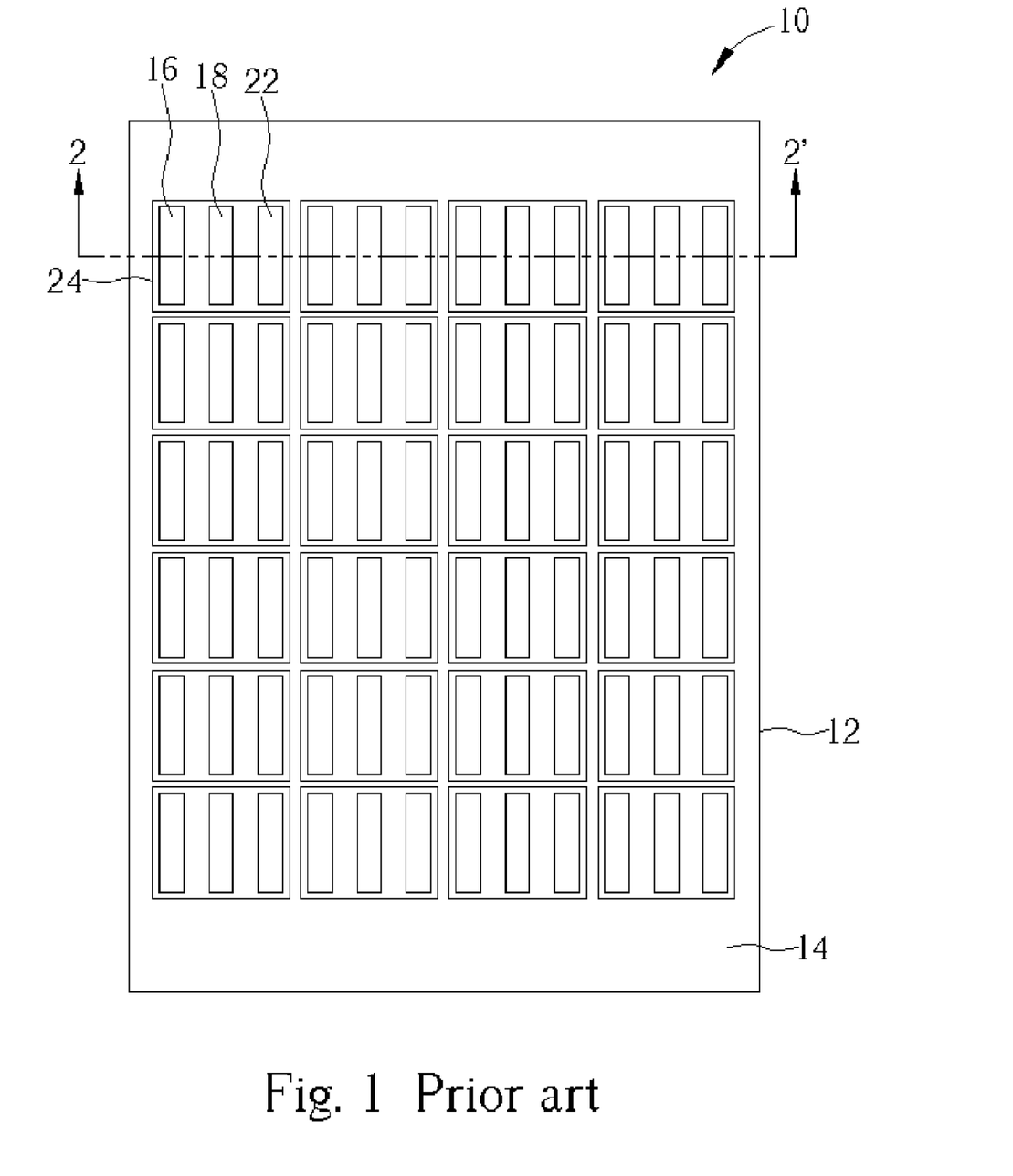
FIG. 1 is a schematic diagram of a conventional OLED panel formed by three different colored pixels.

In another frequently adopted conventional method, different materials are utilized to form red pixels, blue pixels, and green pixels. The red pixel, the blue pixel, and the green pixel then make a colored pixel such that the red light beams, the blue light beams, and the green light beams are mixed. Please refer to FIG. 1. FIG. 1 is a schematic diagram of a conventional OLED panel 10 formed by three different colored pixels. As shown in FIG. 1, the conventional OLED panel 10 comprises a transparent substrate 12. The transparent substrate 12 may be a glass substrate, a plastic substrate, or a quartz substrate. A plurality of red pixels 16, blue pixels 18, and green pixels 22, arranged in a matrix, are included on the surface 14 of the transparent substrate 12. The neighboring red pixel 16, blue pixel 18, and green pixel 22 form a colored pixel 24.

Figure 2:
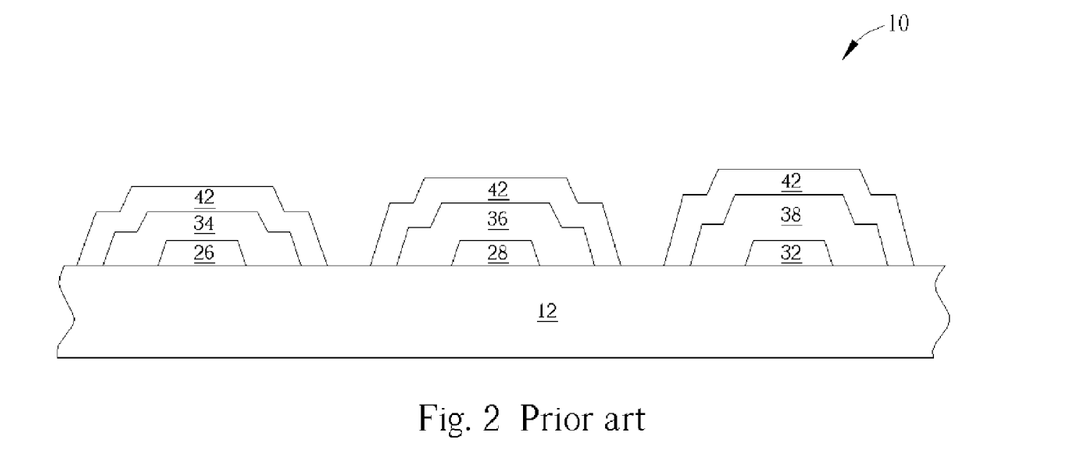
FIG. 2 is a cross-sectional diagram of the OLED panel shown in FIG. 1 along line 2–2'.

Please refer to FIG. 2. FIG. 2 is a cross-sectional diagram of the OLED panel 10 shown in FIG. 1 along line 2–2'. As shown in FIG. 2, each of the pixels 16, 18, 22 (please refer back to FIG. 1) in the OLED panel 10 respectively comprises a transparent conductive layer 26, 28, 32, and each of the transparent conductive layers 26, 28, 32 is formed on the transparent substrate 12 and used as an anode of each of the OLEDs. An organic thin film 34 is formed on the transparent conductive layer 26. An organic thin film 36 is formed on the transparent conductive layer 28. An organic thin film 38 is formed on a surface of the transparent conductive layer 32. A metal layer 42 is respectively formed on a surface of the organic thin film 34, 36, 38, and each of the metal layers 42 is used as a cathode of each of the OLEDs. Since the organic thin films 34, 36, 38, may have different material compositions, thickness, or combinations, each of the pixels 16, 18, 22 in the OLED panel 10 will emit different colored light beams to form the colored pixel 24.

On the other hand, the conventional method, which utilizes materials for generating white light beams and let white light beams pass through red color filters, blue color filters, and green color filters to respectively generate red light beams, blue light beams, and green light beams, tends to cause problems of unsatisfactory alignment accuracy. Not only do the three different colored light beams oftentimes appear unbalanced, but the aperture ratio is also reduced. When utilizing different materials to form the red pixel, the blue pixel, and the green pixel and combining the three different colored pixels as a colored pixel to mix the red light beams, the blue light beams, and the green light beams, a problem of discrepancies in organic thin films in different colored pixels often emerges. Due to the discrepancies in organic thin films in different colored pixels, the processing becomes more complex. Furthermore, the problem of unsatisfactory alignment accuracy and other problems incurred from processing occur when the process control is bad, leading to defects on products.

SUMMARY OF INVENTION

The present invention provides an OLED display to solve the above-mentioned problems.

According to the present invention, an organic light emitting diode display comprises a substrate defined with a plurality of pixel areas, a heating circuit structure, and a plurality of organic light emitting diodes corresponding to each of the pixel areas. The heating circuit structure comprises a first conductive line and a second conductive line not connected to each other formed on the substrate, a first isolation layer comprising a plurality of first contact holes exposing the first conductive line and the second conductive line formed on the substrate, a plurality of first heating wires and a plurality of second heating wires disposed on the substrate, a ground electrode being electrically connected to each of the first heating wires and each of the second heating wires. Each of the first heating wires and each of the second heating wires are electrically connected to the first conductive line and the second conductive line, respectively, through each of the first contact holes and cover portions of each of the pixel areas.

In the present invention, an OLED display incorporating the heating circuit structure are placed above or underneath the OLEDs. Each of the first and the second heating wires may be disposed underneath the buffer layer, or may be disposed above or underneath each of the OLEDs. In this invention, pixels that are originally designed to emit one colored light beam, for example, blue light beams are used. The heating process enabled by the heating circuit will transform such pixels so as to enable the OLEDs to emit other light beams, such as red light beams and green light beams. Color filters are not necessary, thereby avoiding the problem of unsatisfactory alignment and at the same time, improving the aperture ratio. In addition, it is not necessary to deposit the organic thin films corresponding to different colors, thereby simplifying the manufacturing process. In summary, the present invention OLED display has the advantages of low manufacturing cost, simple heating process, and high throughput.

These and other objectives of the claimed invention will become obvious to those of ordinary skill in the art after having read the following detailed description of the preferred embodiment that is illustrated in the various figures and drawings.

DETAILED DESCRIPTION

Figure 3:
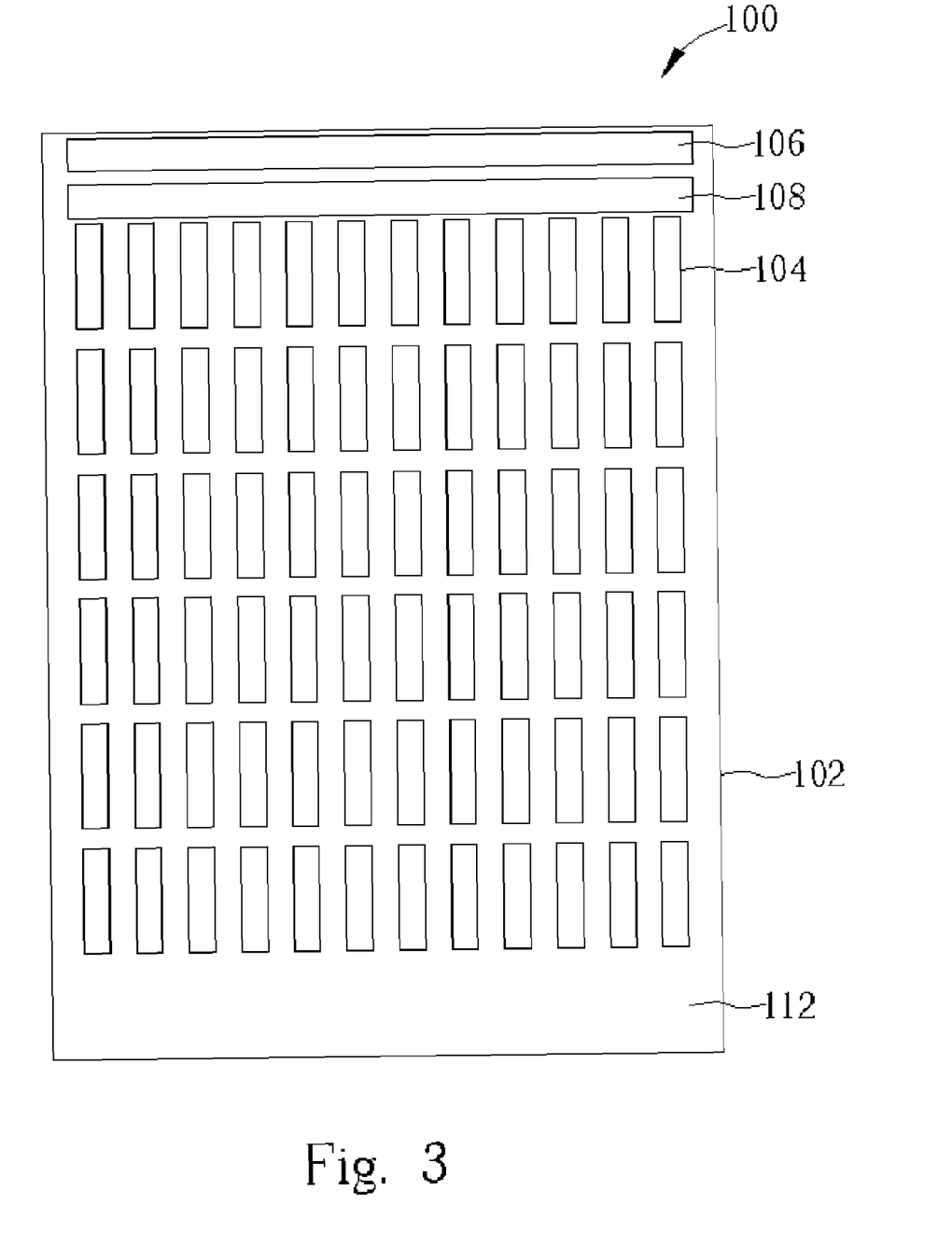
FIG. 3 to FIG. 7 are schematic diagrams of an OLED panel according to a first preferred embodiment of the present invention.

Please refer to FIG. 3 to FIG. 7. FIG. 3 to FIG. 7 are schematic diagrams of an OLED panel 100 according to a first preferred embodiment of the present invention. As shown in FIG. 3, the present invention OLED panel 100 comprises a transparent substrate 102, and the transparent substrate 102 may be a glass substrate, a plastic substrate, or a quartz substrate. A pixel array area (not shown) and a periphery circuit area (not shown) are defined on the transparent substrate 102. A plurality of pixel areas 104 are defined in the pixel array area, and each of the pixel areas 104 is used to accommodate each OLED device and its corresponding capacitor and thin film transistor. The periphery circuit area is used to accommodate control circuitry. A first conductive line 106 and a second conductive line 108 not connected to each other are formed on the surface 112 of the transparent substrate 102. In fact, the first and the second conductive lines 106, 108 and signal lines (not shown) formed on the OLED panel 100 are formed by patterning the same metal layer. The first and the second conductive lines 106, 108 can be a tungsten (W) line, a chrome (Cr) line, or another conductive metal line.

Figure 4:
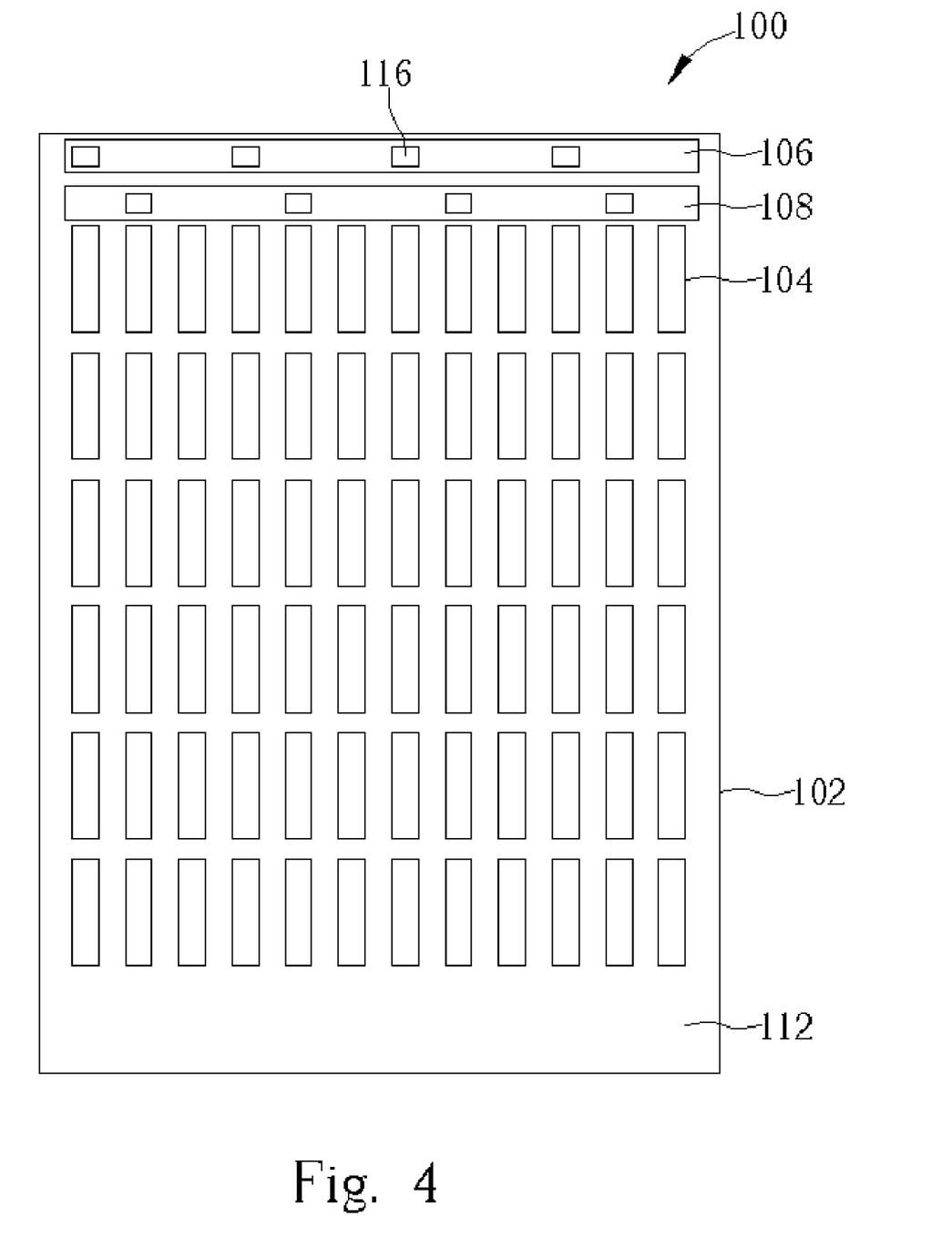

As shown in FIG. 4, the OLED panel 100 further comprises a first isolation layer (not shown) disposed on the transparent substrate 102. The first isolation layer covers each of the pixel areas 104 and the first and the second conductive lines 106, 108. A plurality of first contact holes 116 are included in the first isolation layer, and each of the first contact holes 116 exposes portions of the first or the second conductive lines 106, 108. The first isolation layer comprises a silicon oxide layer formed by inputting tetra-ethyl-ortho-silicate as a reaction gas (TEOS-SiO$_2$ layer), a silicon oxide layer, or a silicon nitride layer.

Figure 5:
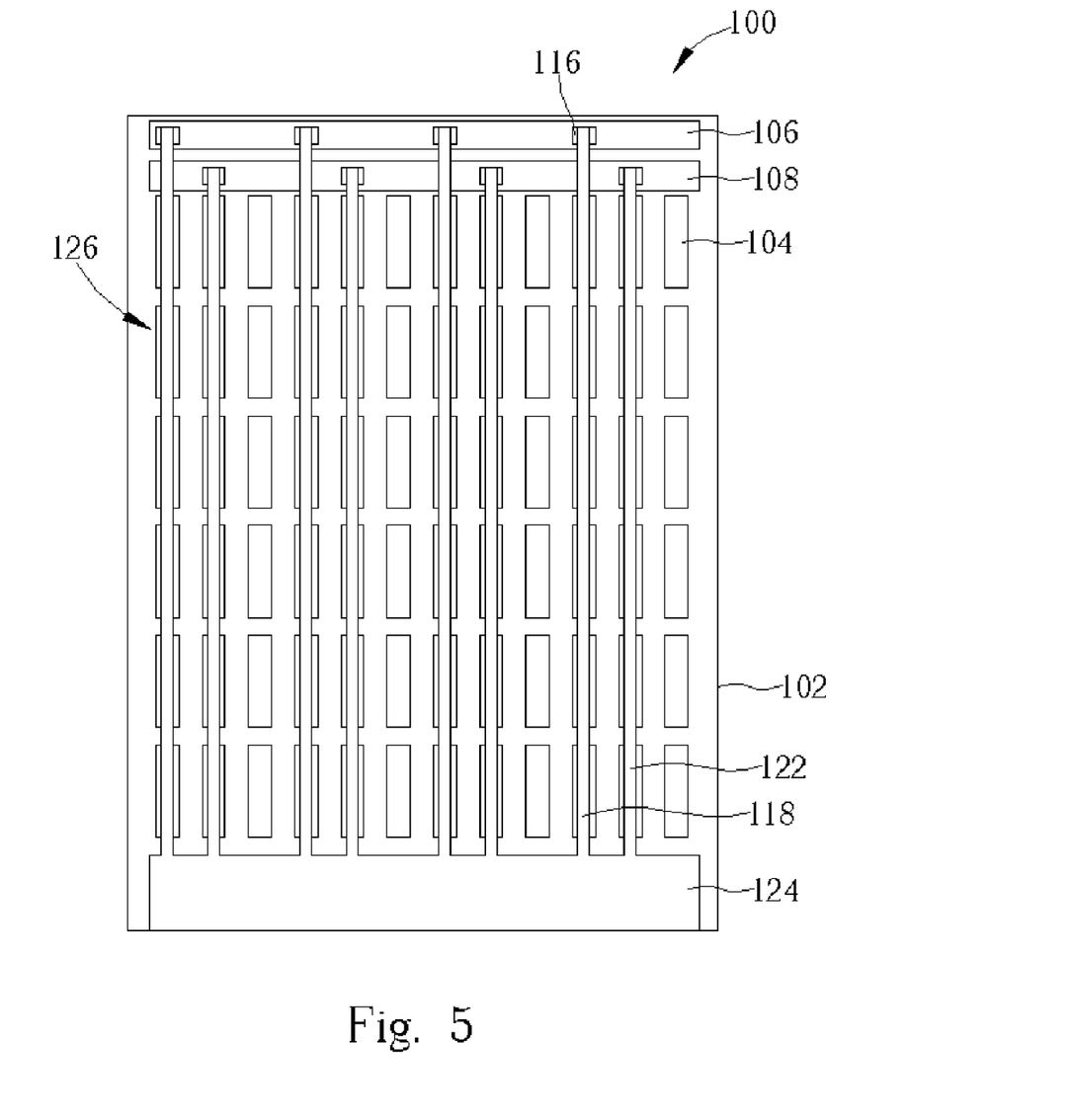

As shown in FIG. 5, the OLED panel 100 further comprises a plurality of first heating wires 118 and a plurality of second heating wires 122 disposed on the transparent substrate 102. Each of the first and the second heating wires 118, 122 is electrically connected to the first and the second conductive lines 106, 108, respectively, through each of the first contact holes 116. Each of the first and the second heating wires 118, 122 covers portions of each of the pixel areas 104. Each of the first and the second heating wires 118, 122 is composed of transparent materials such as indium tin oxide (ITO) and indium zinc oxide (IZO). Each of the first and the second heating wires 118, 122 may also be composed of semi-transparent materials.

A ground electrode 124 is further disposed on the transparent substrate 102. The ground electrode 124 is electrically connected to each of the first and the second heating wires 118, 122 so as to maintain the stability of the potentials on the first and the second heating wires 118, 122. Ground electrode 124 may be an electrode electrically connected to other potentials. As long as each of the first and the second heating wires 118, 122 is supplied with stable and sufficient heating voltage, it is within the scope of the present invention. Since the first and the second conductive lines 106, 108 and the first and the second heating wires 118, 122 are electrically isolated by the first isolation layer, the first and the second heating wires 118, 122 in a heating circuit structure 126, including the first and the second conductive lines 106, 108, the first and the second heating wires 118, 122, and the ground electrode 124, are not affected by each other. At the same time, the ground electrode 124 may be composed of transparent materials, such as indium tin oxide or indium zinc oxide, or opaque metal materials.

Figure 6:
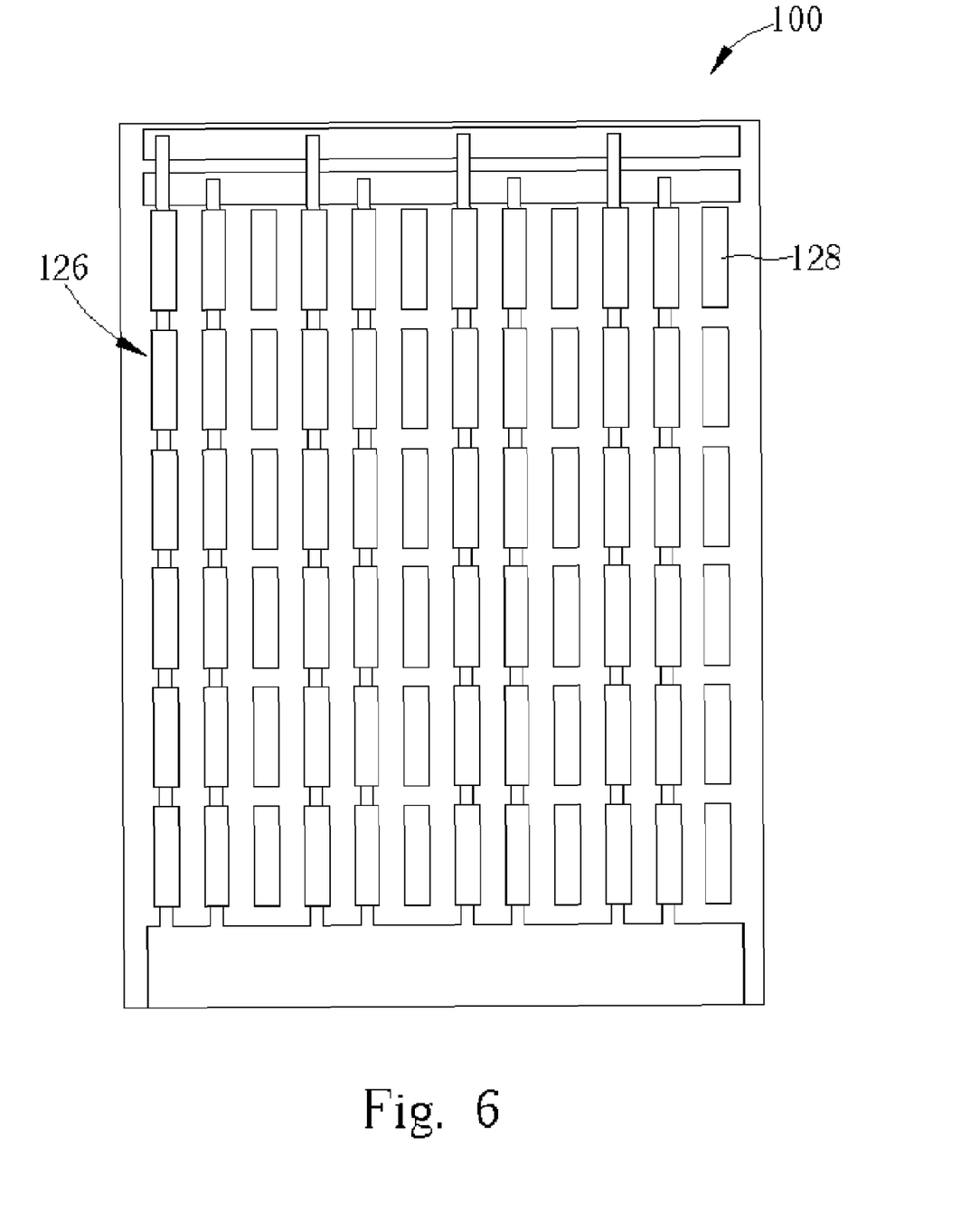

A second isolation layer (not shown) is further formed on the transparent substrate 102. The second isolation layer covers the heating circuit structure 126. A plurality of second contact holes (not shown) are included in the second isolation layer. A plurality of OLEDs 128 (as shown in FIG. 6) are disposed on the second isolation layer, and each of the OLEDs 128 corresponds to each of the pixel areas 104. Each of the OLEDs 128 comprises a transparent electrode (not shown) formed on the second isolation layer, an organic thin film (not shown) formed on the transparent electrode, and a metal layer (not shown) formed on the organic thin film. Each of the transparent electrodes, being an indium tin oxide layer or an indium zinc oxide layer, is used as an anode of each of the OLEDs 128. A metal layer, being a magnesium (Mg) layer, an aluminum (Al) layer, a lithium (Li) layer, or an alloy layer, is used as a cathode of each of the OLEDs 128. In fact, the metal layer may cover all of the pixel areas 104, or cover one of the pixel areas 104 depending on practical requirements. Each of the pixel areas 104 comprises at least one thin film transistor, and each of the transparent electrodes is electrically connected to a drain (not shown) of one of the thin film transistors through each of the second contact holes.

Figure 7:
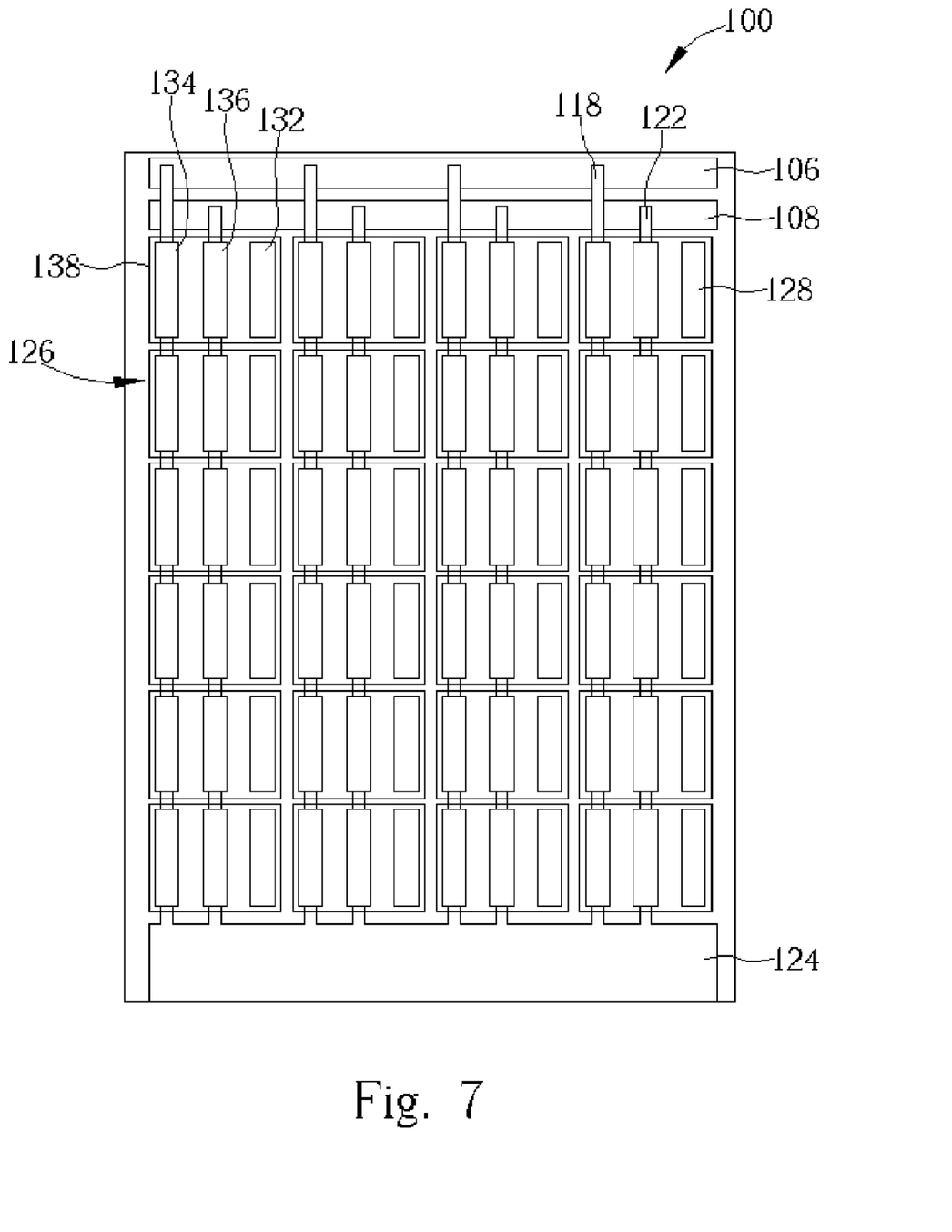

As shown in FIG. 7, the first and the second conductive lines 106, 108 are electrically connected to a same voltage source or a same current source through an external power line (not shown). However, they may be electrically connected to different voltage sources or different current sources. Consequently, when an external voltage is applied to the heating circuit structure 126 through the first and the second conductive lines 106, 108, a corresponding current is generated and flows through each of the first and the second heating wires 118, 122. When the current flows through the heating wires 118, 112, heat is generated according to the following formula: $P=I^2R$. Consequently, each of the first and the second heating wires 118, 122 will provide heat energy to each of the OLEDs 128 above it. At this time, each of the OLEDs 128 which is not heated is not affected at all. By adjusting the magnitude of the external voltage and the time for heating process, each of the OLEDs 128 above each of the first heating wires 118 and each of the OLEDs 128 above each of the second heating wires 122 will absorb different amount of heat energy to alter the characteristics of the OLEDs 128.

When operating, the OLEDs 128 which are not heated will emit a certain colored light beam, such as blue light beams and the pixel areas corresponding to these OLEDs 128 become blue pixels 132. The OLEDs 128 that absorb more heat energy will emit red light beams and the pixel areas corresponding to these OLEDs 128 become red pixels 134. The OLEDs 128 that absorb less heat energy will emit green light beams and the pixel areas corresponding to these OLEDs 128 become green pixels 136. The neighboring blue pixel 132, red pixel 134, and green pixel 136 constitute a colored pixel 138. It is worth noting that a width of the ground electrode 124 needs to be greater than widths of the first and the second conductive lines 106, 108, when the ground electrode 124 is composed of indium tin oxide or indium zinc oxide, to decrease the discrepancy of the resistance values between the blue pixels 132, the red pixels 134, and the green pixels 136. The heating uniformity is thus improved to improve the balance between the blue light beams, the red light beams, and the green light beams. However, this limitation does not exist when the ground electrode 124 is formed from metals.

Each of the first and the second heating wires 118, 122 may be in any shape, and not limited to the stripe structure shown in the figures. Since the OLEDs 128 emitting green light beams, red light beams, and blue light beams can be arranged in a mosaic shape, in a triangular shape, or in a stripe shape, each of the first and the second heating wires 118, 122 may be presented as a zigzag line or other types. In addition, the thin film transistor (not shown) in each of the pixel areas 104 forms a driving circuit to allow each pixel in the panel to generate a corresponding output current according to the signal transmitted by the driving circuit. The brightness of each of the OLEDs 128 is thus controlled. Furthermore, the present invention heating circuit structure is not only applied to the active matrix displays, but also is applied to the passive matrix displays.

However, the present invention method is not limited to disposing the above-mentioned heating circuit structure 126 underneath each of the OLEDs. Actually, each of the first and the second heating wires 118, 122 may be disposed above each of the OLEDs in the present invention OLED panel 100. Under the circumstances, each of the OLEDs and the first and the second conductive lines 106, 108 are disposed on the transparent substrate 102 first. In addition, the first and the second conductive lines 106, 108 and signal lines (not shown) formed on the OLED panel 100 are formed by patterning the same metal layer. A first isolation layer (not shown) is utilized to electrically isolate each of the OLEDs and each of the first and the second heating wires 118, 122. Or another isolation layer (not shown) is formed before forming each of the first and the second heating wires 118, 122 to reinforce the electrical isolation between each of the OLEDs and each of the first and the second heating wires 118, 122. A plurality of contact holes (not shown) in the first isolation layer (or together with a plurality of contact holes in another isolation layer) are utilized to electrically connect each of the first and the second heating wires 118, 122, and to respectively electrically connect each of the first and the second heating wires 118, 122 to the first and the second conductive lines 106, 108. When operating, each of the first heating wires 118 will heat the corresponding OLEDs to allow the OLEDs underneath it to emit green light beams. Each of the second heating wires 122 will heat the corresponding OLEDs to allow the OLEDs underneath it to emit red light beams. The OLEDs which are not heated will emit blue light beams. In this structure, other practicing methods are the same as those in the structure in which the OLEDs 128 are disposed above the heating circuit structure 126.

Figure 8:
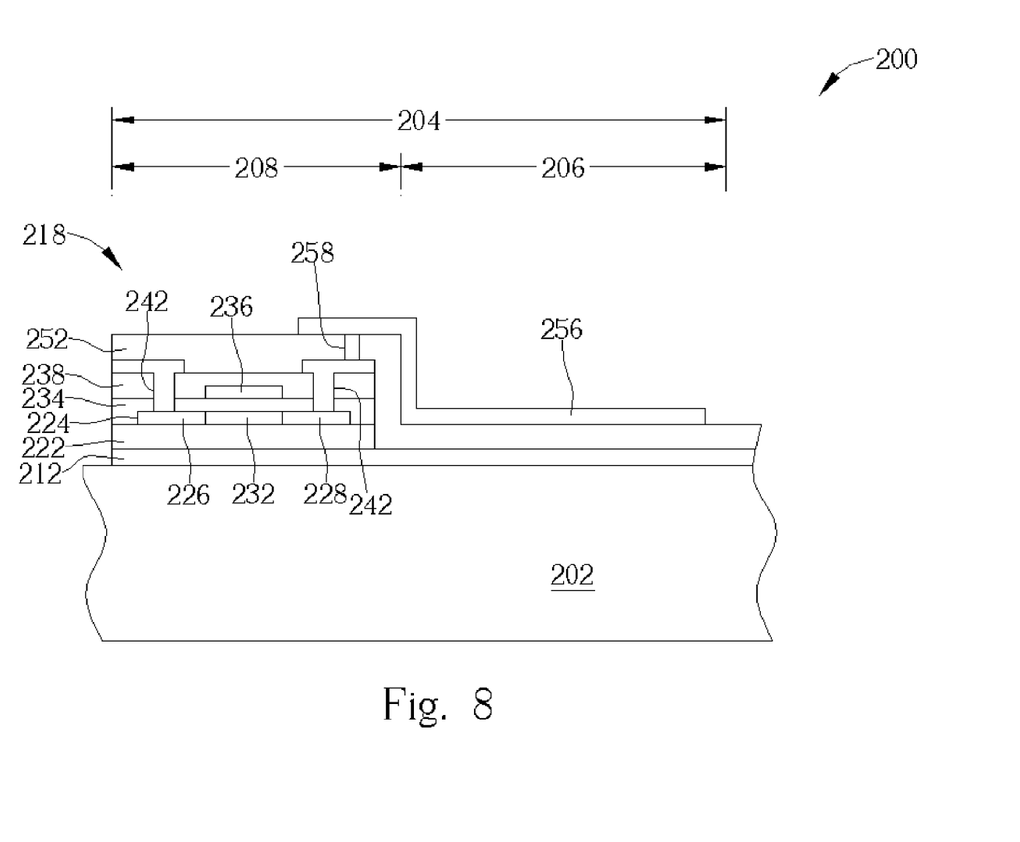
FIG. 8 to FIG. 9 are cross-sectional diagrams of an OLED panel according to a second preferred embodiment of the present invention.
Figure 9:
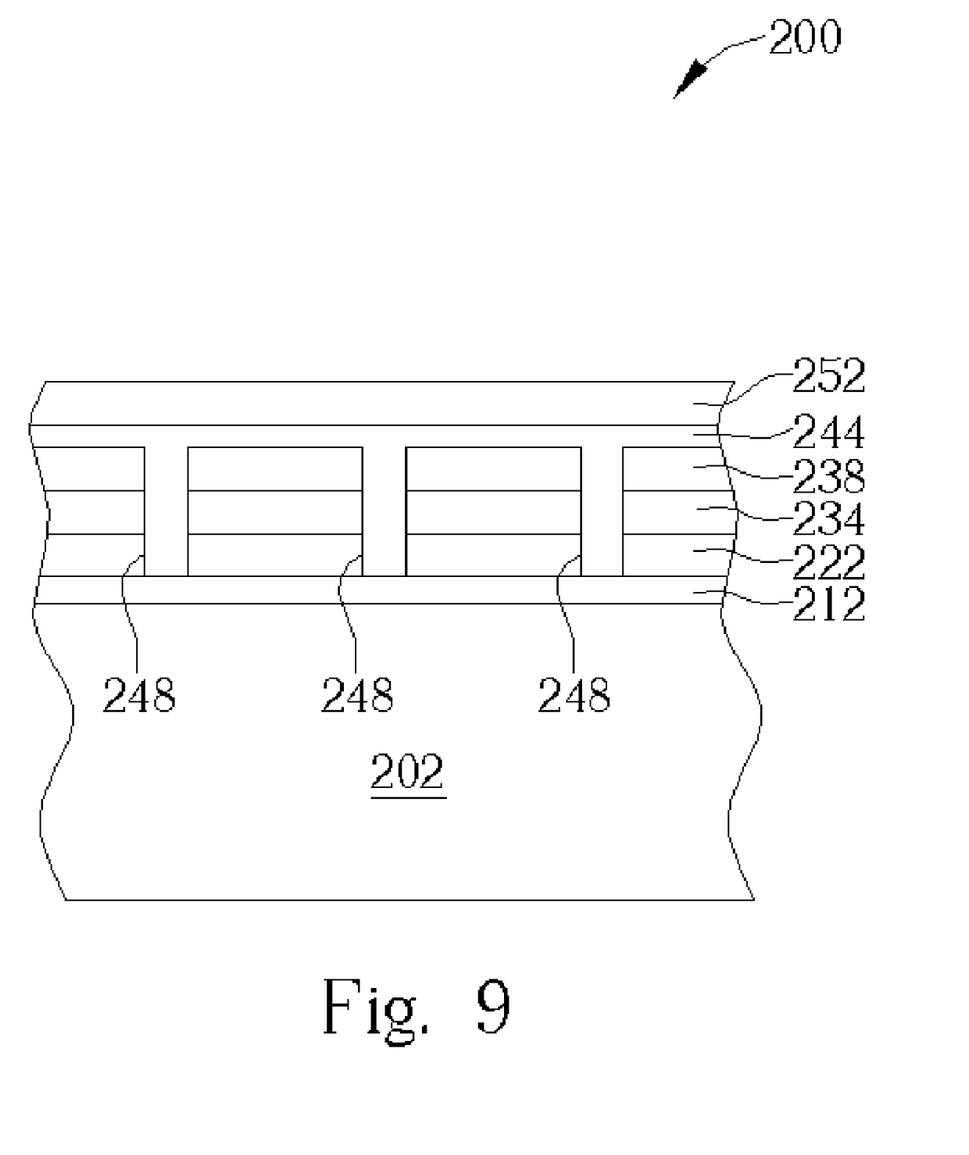
Figure 10:
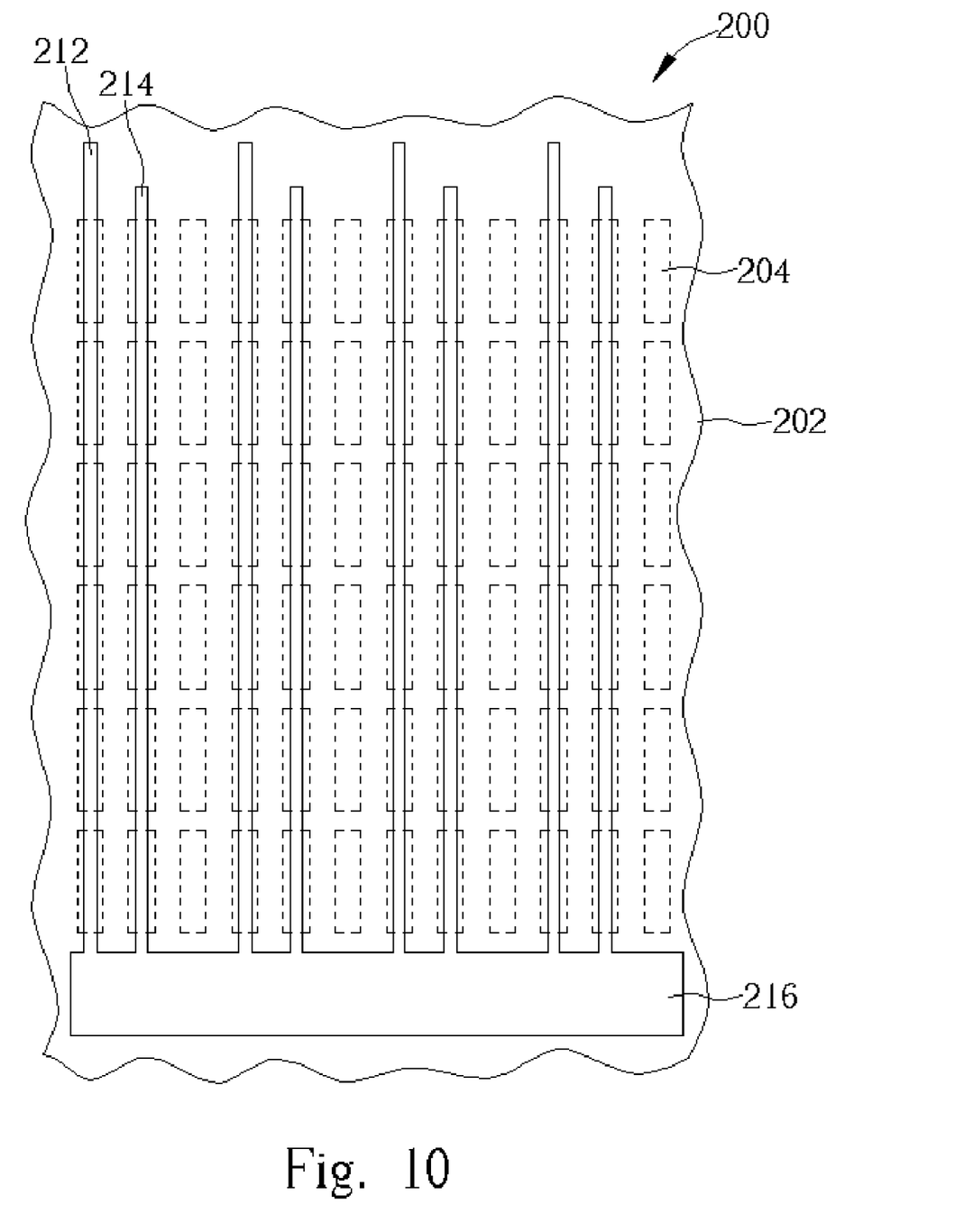
FIG. 10 to FIG. 13 are top views of the OLED panel shown in FIG. 8 and FIG. 9.

In addition, another method is applicable even though the heating circuit structure is disposed underneath each of the OLEDs in the present invention. Please refer to FIG. 8 to FIG. 13. FIG. 8 to FIG. 9 are cross-sectional diagrams of an OLED panel 200 according to a second preferred embodiment of the present invention. FIG. 10 to FIG. 13 are top views of the OLED panel 200 shown in FIG. 8 and FIG. 9. As shown in FIG. 8 and FIG. 10, the present invention OLED panel 200 comprises a transparent substrate 202, and the transparent substrate 202 may be a glass substrate, a plastic substrate, or a quartz substrate. A pixel array area (not shown) and a periphery circuit area (not shown) are defined on the transparent substrate 202. A plurality of pixel areas 204 are defined in the pixel array area, and a diode region 206 and a thin film transistor region 208, used for accommodating an OLED device and its corresponding capacitor and thin film transistor, are defined in each of the pixel areas 204. The periphery circuit area is used for accommodating control circuitry.

A plurality of first and second heating wires 212, 214 are disposed on the transparent substrate 202, and each of the first and second heating wires 212, 214 covers portions of each of the pixel areas 204. The transparent substrate 202 further comprises a ground electrode 216 connected with each of the first and second heating wires 212, 214. Each of the first and the second heating wires 212, 214 and the ground electrode 216 are composed of transparent materials such as indium tin oxide or indium zinc oxide. Actually, each of the first and the second heating wires 212, 214 may be composed of semi-transparent materials. In addition, the ground electrode 216 may be composed of opaque metal materials.

As shown in FIG. 8, a thin film transistor 218 is disposed on the heating wire (here the first heating wire 212 is taken as an example for illustration purpose) in the thin film transistor region 208, and a buffer layer 222 is included between the thin film transistor 218 and the first heating wire 212. The thin film transistor 218 comprises a polysilicon layer (poly-Si layer) 224. The polysilicon layer 224 comprises a source electrode 226, a drain electrode 228, and a channel 232 of the thin film transistor 218. A gate insulating layer (GI layer) 234 is disposed on the buffer layer 222 and covers the polysilicon layer 224. A gate electrode 236 is disposed on the gate insulating layer 234 above the channel 232. An inter layer dielectric (ILD) 238 is disposed on the gate insulating layer 234 and covers the gate electrode 236, and at least one first contact hole 242 penetrates through the inter layer dielectric 238 and the gate insulating layer 234. The buffer layer 222 is composed of silicon oxide. The buffer layer 222 is not only used for preventing impurities in the transparent substrate 202 from diffusing upwards, but is also used as a buffer when laser-processing the polysilicon layer 224.

Figure 11:
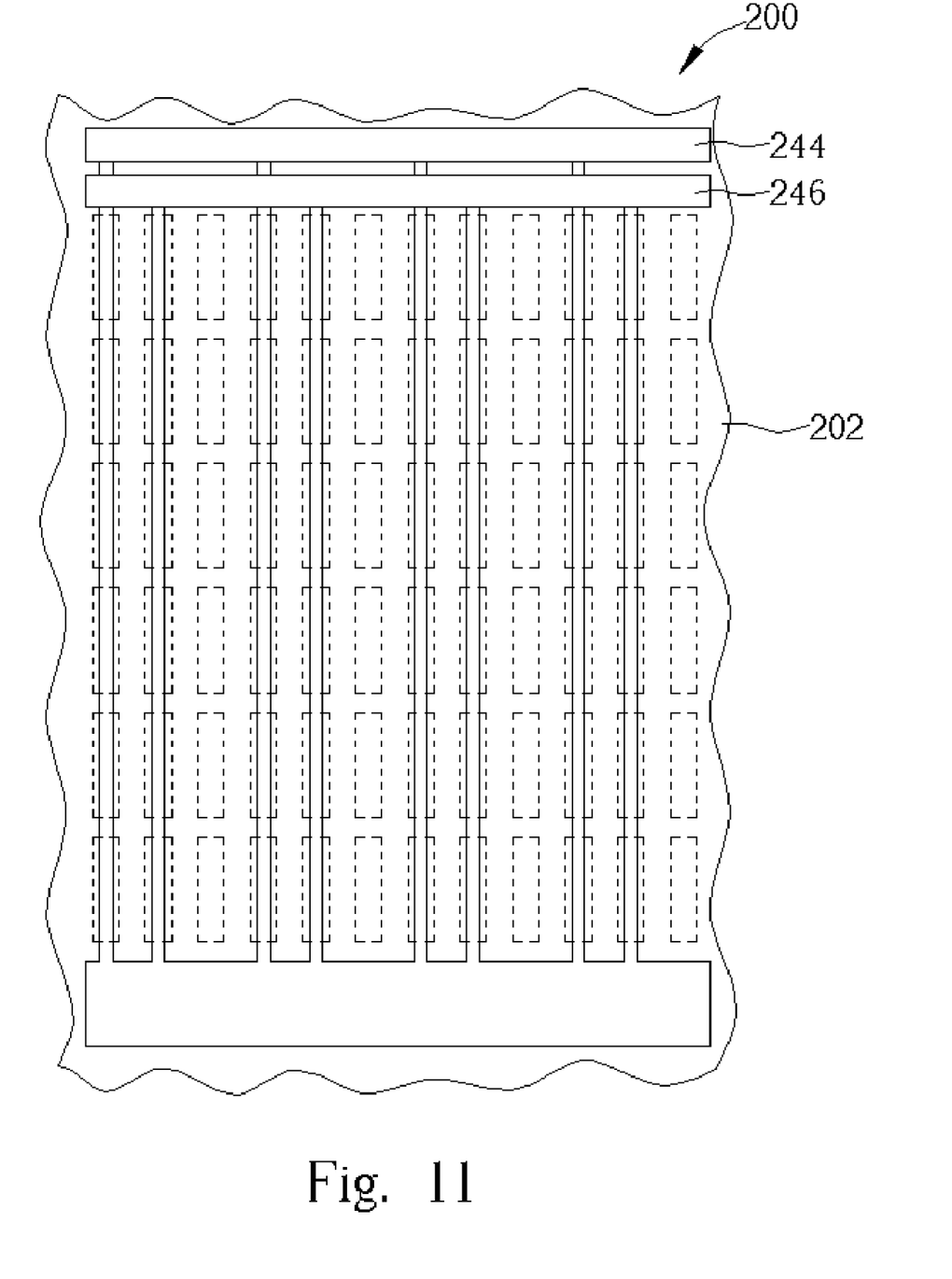

As shown in FIG. 9 and FIG. 11, a first and a second conductive lines 244, 246 not connected to each other are disposed on the transparent substrate 202. The first and the second conductive lines 244, 246 are electrically connected to the first and the second heating wires 212, 214, respectively, through a plurality of second contact holes 248 penetrating through the buffer layer 222, the gate insulating layer 234, and the inter layer dielectric 238 outside each of the pixel areas 204. In FIG. 9, the situation that the first conductive line 244 is electrically connected to the first heating wire 212 through the second contact holes 248 is taken as an example for illustration purpose.

Please refer to FIG. 8, it is worth noting that all of the buffer layer 222, the gate insulating layer 234, and the inter layer dielectric 238 in each of the diode regions 206 are etched when forming the first and the second contact holes 242, 248 of the OLED panel 200. The heating efficiency is secured because there is no thick isolation layer disposed between the first heating wire 212 and the OLED (not shown, there is no thick isolation layer disposed between the second heating wire 214 and the OLED with the same reason). In fact, the first and second conductive lines 244, 246 and the signal lines (not shown) formed on the OLED panel 200 are formed by patterning the same metal layer. The source electrode 226 of the thin film transistor 218 is electrically connected to a corresponding signal line (not shown) through the first contact hole 242. The first and the second conductive lines 244, 246 can be a tungsten line, a chrome line, or other conductive metal lines.

As shown in FIG. 8 and FIG. 9, an isolation layer 252 is formed on the transparent substrate 202 and covers the thin film transistor 218 and the first heating line 212. The isolation layer 252 is composed of silicon oxide, and a thickness of the isolation layer 252 is approximately equal to 1000 angstroms (Å). Actually, the isolation layer 252 covers the entire transparent substrate 202. That means, each of the first and the second heating wires 212, 214, each of the thin film transistors 218, the first and the second conductive lines 244, 246, and the ground electrode 216 are protected by the isolation layer 252.

Figure 12:
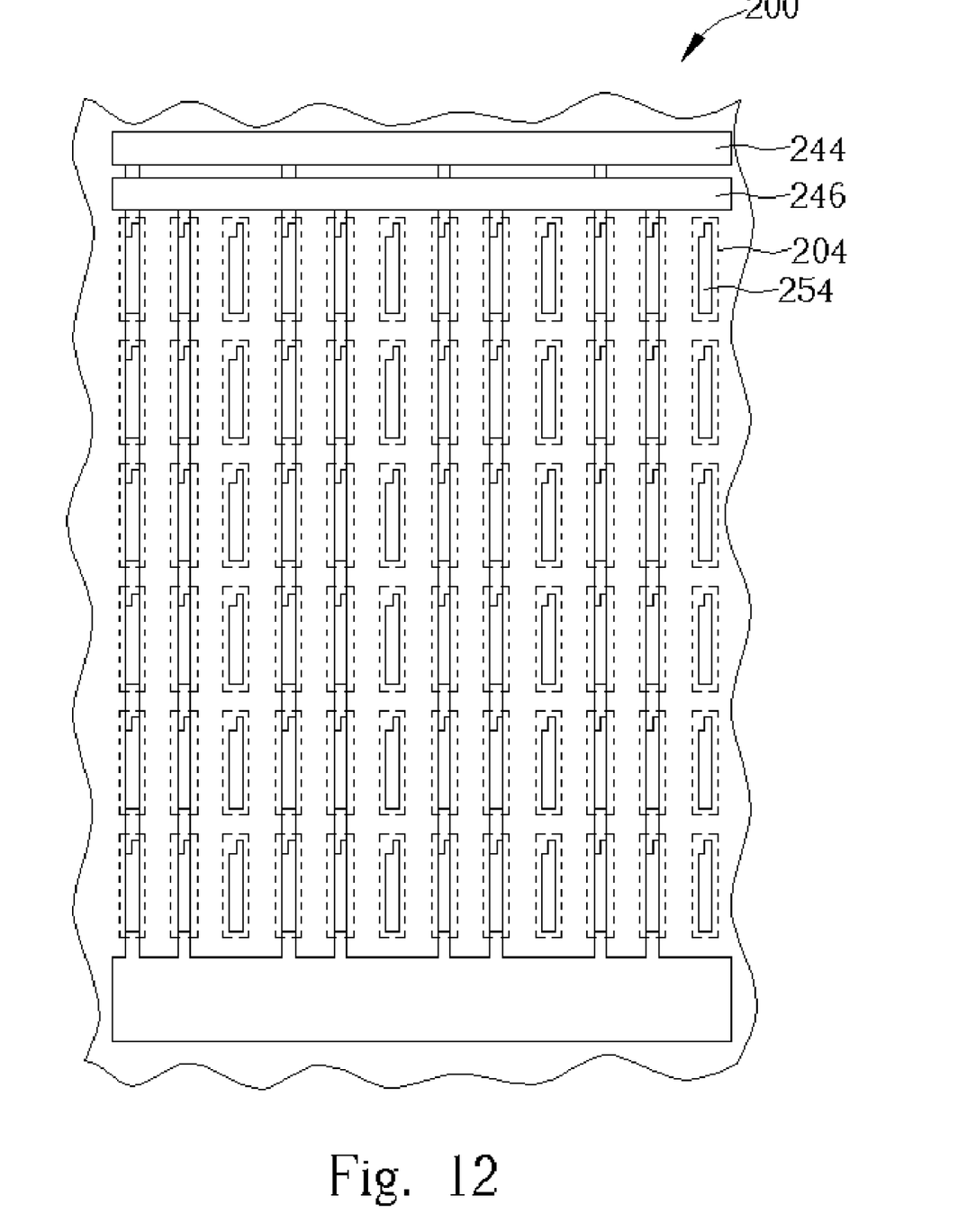

As shown in FIG. 8 and FIG. 12, an OLED 254 is disposed on the isolation layer 252 in the diode region 206. The OLED 254 comprises a transparent pixel electrode 256 formed on the isolation layer 252, an organic thin film (not shown) formed on the transparent pixel electrode 256, and a metal layer (not shown) formed on the organic thin film. The OLED 254 is the same as the OLED 128 in the first preferred embodiment. In FIG. 8, only the transparent pixel electrode 256 is indicated and the organic thin film and the metal layer are not indicated because their shapes are variable. In fact, the metal layer may cover all of the pixel areas 204, or cover one of the diode regions 206 depending on practical requirements. The transparent pixel electrode 256 is electrically connected to the drain electrode 228 of the thin film transistor 218 through a third contact hole 258. As shown in FIG. 12, one of the OLEDs 254 is disposed in each of the pixel areas 204.

Figure 13:
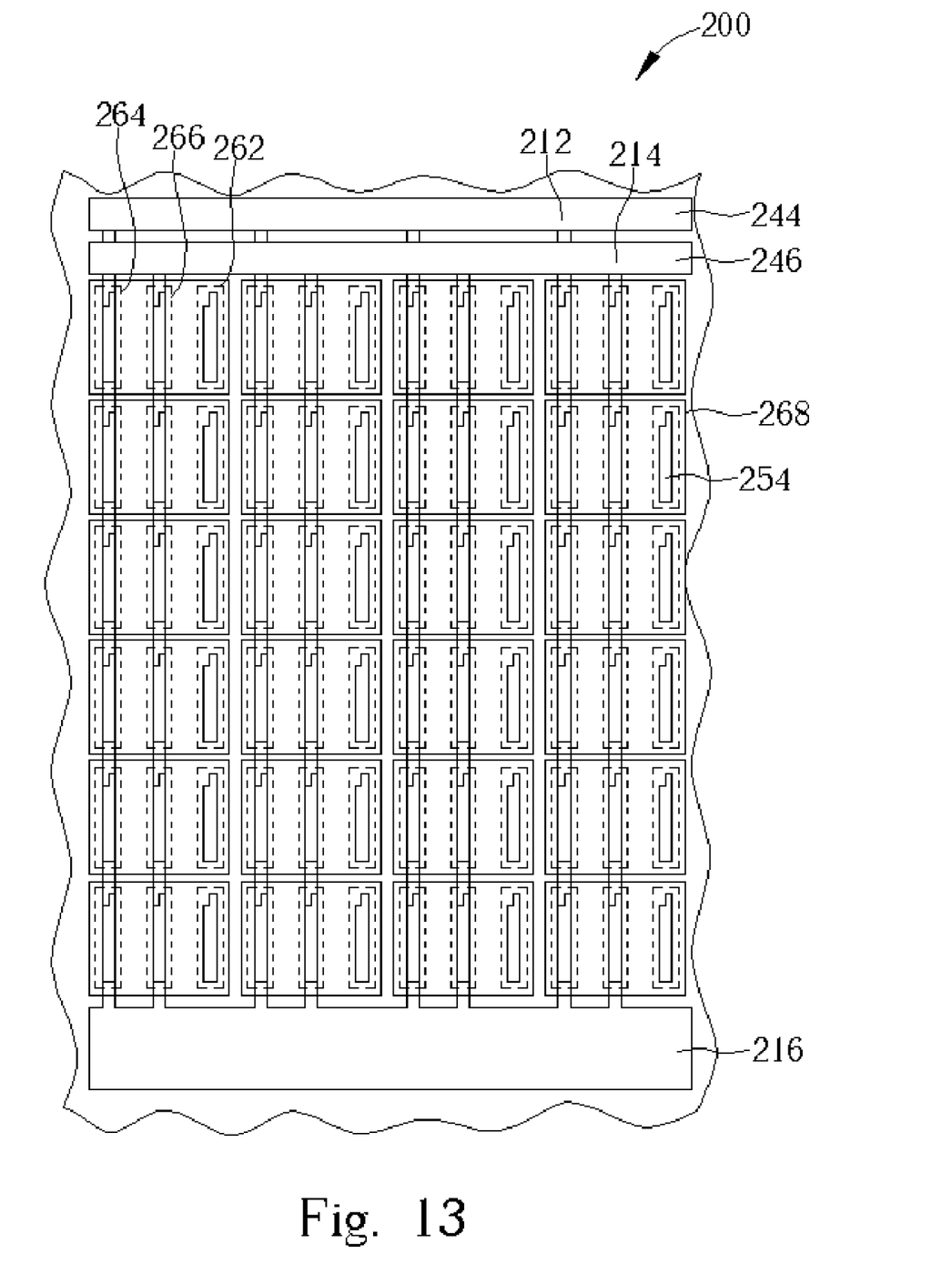

As shown in FIG. 13, the first and the second conductive lines 244, 246 are electrically connected to a same voltage source or a same current source through an external power line (not shown), or they may be electrically connected to different voltage sources or different current sources. The principle of heating each of the OLEDs 254 is the same as the first preferred embodiment of the present invention.

When operating, the OLEDs 254 which are not heated will emit a certain colored light beams, such as blue light beams and the pixel areas corresponding to these OLEDs 254 become blue pixels 262. The OLEDs 254 absorbing more heat energy will emit red light beams and the pixel areas corresponding to these OLEDs 254 become red pixels 264. The OLEDs 254 absorbing less heat energy will emit green light beams and the pixel areas corresponding to these OLEDs 254 become green pixels 266. The neighboring blue pixel 262, red pixel 264, and green pixel 266 constitute a colored pixel 268. In this preferred embodiment, the OLEDs 254 above each of the first heating wires 212 and each of the second heating wires 214 emit red light beams and green light beams, respectively.

In this preferred embodiment, the connection method of the ground electrode 216 is the same as that of the first preferred embodiment. As long as each of the first and the second heating wires 212, 214 is supplied with stable and sufficient heating voltage, it is within the scope of the present invention. In addition, the size and the material composition of the ground electrode 216 are the same as the first preferred embodiment. No matter how, the heating uniformity between the red pixels 264 and the green pixels 266 need to be kept to improve the balance between the blue, red, and green light beams. Furthermore, since the first and the second conductive lines 244, 246 and the first and the second heating wires 212, 214 are electrically isolated, the first and the second heating wires 212, 214 in the heating circuit structure, including the first and the second conductive lines 244, 246, the first and the second heating wires 212, 214, and the ground electrode 216, are not affected by each other.

Since the OLEDs 254 emitting green, red, and blue light beams can be arranged in different shapes, as described in the first preferred embodiment, each of the first and the second heating wires 212, 214 may be presented as a zigzag line or other types. Moreover, the first and the second heating wires 212, 214 may skip each of the thin film transistors 218. Under the circumstances, each of the thin film transistors 218 is directly disposed on the transparent substrate 202 in each of the thin film transistor regions 208. Moreover, the thin film transistor 218 in each of the pixel areas 204 and another thin film transistor (not shown) form a driving circuit to allow each pixel in the panel to generate a corresponding output current according to the signal transmitted by the driving circuit. The brightness of each of the OLEDs 254 is thus controlled. In addition, the present invention heating circuit structure can not only be applied to the active matrix panels, but can also be applied to the passive matrix panels.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An organic light emitting diode (OLED) display comprising:
    a substrate, a plurality of pixel areas being defined on the substrate;

a heating circuit structure comprising:
- a first conductive line and a second conductive line not connected to each other formed on the substrate;
- a first isolation layer formed on the substrate, the first isolation layer comprising a plurality of first contact holes exposing the first conductive line and the second conductive line;
- a plurality of first heating wires and a plurality of second heating wires disposed on the substrate, each of the first heating wires and each of the second heating wires being electrically connected to the first conductive line and the second conductive line respectively through each of the first contact holes and covering portions of each of the pixel areas; and
- a ground electrode being electrically connected to each of the first heating wires and each of the second heating wires; and
- a plurality of organic light emitting diodes corresponding to each of the pixel areas.

2. The display of claim 1 wherein both the first heating wire and the second heating wire are transparent heating wires.

3. The display of claim 1 further comprising a second isolation layer covering the heating circuit structure, and each of the organic light emitting diodes is disposed on the second isolation layer.

4. The display of claim 3 wherein each of the first heating wires is used to heat the corresponding organic light emitting diodes to allow the organic light emitting diodes above each of the first heating wires to emit green light, and each of the second heating wires is used to heat the corresponding organic light emitting diodes to allow the organic light emitting diodes above each of the second heating wires to emit red light.

5. The display of claim 4 wherein each of the organic light emitting diodes which are not heated emits blue light.

6. The display of claim 1 wherein the organic light emitting diodes are disposed underneath the first isolation layer.

7. The display of claim 6 wherein each of the first heating wires is used to heat the corresponding organic light emitting diodes to allow the organic light emitting diodes underneath each of the first heating wires to emit green light, and each of the second heating wires is used to heat the corresponding organic light emitting diodes to allow the organic light emitting diodes underneath each of the second heating wires to emit red light.

8. The display of claim 7 wherein each of the organic light emitting diodes which are not heated emits blue light.

9. The display of claim 1 wherein each organic light emitting diode comprises:
- a transparent electrode, the transparent electrode is used as an anode;
- an organic thin film formed on the transparent electrode; and
- a metal layer formed on the organic thin film, the metal layer is used as a cathode.

10. The display of claim 1 wherein the ground electrode is a transparent ground electrode, wherein a width of the ground electrode is greater than widths of the first conductive line and the second conductive line.

11. An organic light emitting diode (OLED) display comprising:
- a substrate, a plurality of pixel areas being defined on the substrate, a diode region and a thin film transistor (TFT) region being defined in each of the pixel areas;
- a first conductive wire and a second conductive wire not connected to each other formed on the substrate:
- a plurality of first heating wires and a plurality of second heating wires disposed on the substrate, each of the first heating wires and each of the second heating wires covering portions of each of the pixel areas;
- a thin film transistor disposed on each of the heating wires in each of the thin film transistor regions;
- an isolation layer formed on the substrate, and the isolation layer covering each of the thin film transistors and each of the heating wires; and
- an organic light emitting diode disposed on the isolation layer in each of the diode regions;

wherein each of the first heating wires is electrically connected to the first conductive wire to heat the corresponding organic light emitting diodes to emit green light, and each of the second heating wires is electrically connected to the second conductive wire to heat the corresponding organic light emitting diodes to emit red light.

12. The display of claim 11 wherein both the first heating wire and the second heating wire are transparent heating wires.

13. The display of claim 11 wherein each of the organic light emitting diodes which are not heated emits blue light.

14. The display of claim 11 wherein a buffer layer is included between each of the thin film transistors and each of the heating wires, and the buffer layer is composed of silicon oxide.

15. The display of claim 11 wherein the isolation layer is composed of silicon oxide, and a thickness of the isolation layer is approximately equal to 1000 angstroms (Å).

16. The display of claim 11 wherein each organic light emitting diode comprises:
- a transparent electrode formed on the isolation layer, the transparent electrode is used as an anode;
- an organic thin film formed on the transparent electrode; and
- a metal layer formed on the organic thin film, the metal layer is used as an cathode.

17. The display of claim 16 wherein the transparent electrode is a pixel electrode of the thin film transistor.

18. The display of claim 11 wherein the first conductive line and the second conductive line are not connected to each other.

19. The display of claim 11 further comprising a ground electrode electrically connected to each of the first heating wires and each of the second heating wires.

20. The display of claim 19 wherein the ground electrode is a transparent ground electrode, wherein a width of the ground electrode is greater than widths of the first conductive line and the second conductive line.

* * * * *